United States Patent [19]
Mullins et al.

[11] Patent Number: 5,596,724
[45] Date of Patent: Jan. 21, 1997

[54] INPUT/OUTPUT DATA PORT WITH A PARALLEL AND SERIAL INTERFACE

[75] Inventors: Jacqueline Mullins; Joseph W. Peterson; John Bartkowiak; Alan F. Hendrickson, all of Austin, Tex.

[73] Assignee: Advanced Micro Devices, Sunnyvale, Calif.

[21] Appl. No.: 191,948

[22] Filed: Feb. 4, 1994

[51] Int. Cl.⁶ ........................................................ G06F 5/00
[52] U.S. Cl. ........................................................ 395/250
[58] Field of Search ........................ 364/DIG. 1 MS File, 364/DIG. 2 MS File; 395/286, 280, 250, 309; 341/100, 101

[56] References Cited

U.S. PATENT DOCUMENTS 4,648,105  3/1987  Priebe et al. ............................. 377/328

FOREIGN PATENT DOCUMENTS 311798  4/1989  European Pat. Off. .......... G06F 7/00

OTHER PUBLICATIONS

Schultes et al, Frequenz, vol. 46 No. 11 pp. 280–284, "Comparison of GMSK Modulators for DECT–Cordless Telephones".

Primary Examiner—Robert B. Harrell
Attorney, Agent, or Firm—H. Dale Langley, Jr.

[57] ABSTRACT

The present invention disclosed an input/output data port circuit which connects a parallel data bus with an input serial data bus and an output serial data bus. The input/output data port is selectively operable in either a linear mode or a buffered mode. The input/output port is comprised of an interface register that is connected to a parallel data bus, a serial input bus and a serial output bus; a temporary register that is serially connected to the interface register, an outbound register that is connected in parallel to the temporary register and serially connected to a serial bus; and an inbound register that is connected in parallel to the temporary register and serially connected to a serial, bus.

19 Claims, 17 Drawing Sheets

INPUT/OUTPUT DATA PORT WITH A PARALLEL AND SERIAL INTERFACE

CROSS-REFERENCE TO RELATED APPLICATIONS

This application is related to the following U.S. patent applications:

| SERIAL NO. | TITLE | INVENTOR(S) |
|---|---|---|
| 07/917,497 | General I/O Port Interrupt Mechanism | Gulick, et al., Now U.S. Pat. No. 5,448,743 |
| 07/917,489 | Improved External Memory Access Control for a Processing Unit | Gulick, et al., Now U.S. Pat. No. 5,408,639 637 |
| 07/917,488 | Method of Weak Pull-up Disable and Mechanism Therefor for Use with Microcontroller in Integrated Circuit and Cordless Telephone Using the Integrated Circuit | Bowles, et al., Now abandoned |
| 07/917,503 | Interrupt Mask Disable Circuit and Method | Bowles, et al., Now abandoned. |
| 07/918,627 | Integrated Circuit and Cordless Telephone Using the Integrated Circuit | Gulick, et al., still pending |
| 07/918,626 | Modulator Test System | Peterson, et al., Now abandoned |
| 07/918,625 | Keypad Scanner Process and Device and Cordless Telephone Employing the Mechanism | Gulick, Now abandoned. |
| 07/918,624 | Serial Interface Module and Method | Gulick, et al., Now U.S. Pat. No. 5,404,459. |
| 07/918,631 | Low Power Emergency Telephone Mode | Peterson, et al., Now abandoned. |
| 07/918,632 | In-Circuit Emulation Capability Mode in Integrated Circuit and Cordless Telephone Using the Integrated Circuit | Gulick, et al., Now abandoned. |
| 07/918,622 | Clock Generator Capable of Shut-down Mode and Clock Generation Method | Peterson, et al., Now abandoned. |
| 07/918,621 | Signal Averager | Gulick, Now U.S. Pat. No. 5,420,904. |
| 08/192,007__; | Power Management Circuit for Use in Digital Cordless Telephones and Like Apparatus | Hendrickson, et al., Now abandoned. |
| 08/191,949__; | Apparatus and Method for Sending Signal Data | Schizlein, et al., stil pending. |
| 08/191,940__; | Burst Synchronization of Time Division Multiplexed Transceiver Pairs | Schnizlein, Now abandoned. |
| 08/191,994__; | Receiver Quality Measurement System for Use in Digital Cordless Telephones and Like Apparatus | Hendrickson, et al., Now abandoned. |
| 08/192,046__; | Dual-Mode Baseband Controller for Radio-Frequency Interfaces Relating to Digital Cordless Telephones | Hendrickson, et al., still pending. |
| 08/192,057__; | Method and Apparatus for External Intermediate Data Processing | Mullins, et al., still pending |
| 08/192,009__; | Metal Programmed Transistor Array | Allee, Now abandoned. |

| SERIAL NO. | TITLE | INVENTOR(S) |
|---|---|---|
| 08/191,818_; | Method and Apparatus for Improved Link Establishment and Monitoring in a Communications System | Hendrickson, still pending. |

All of the related applications are assigned to the assignee of the present invention and are hereby incorporated herein in their entirety by this reference thereto.

BACKGROUND OF THE INVENTION

1. Field of the Invention

This invention relates to circuit architecture for inputting and outputting serial digital data to and from a parallel data bus. More particularly, this invention relates to circuit architecture capable of interfacing a parallel data bus with a serial bus wherein the same bit registers are used to transmit and receive outbound and inbound data.

2. Description of the Prior Art

Both serial and parallel interfaces are well known to those of ordinary skill in the art. Serial interfaces involve time-sequential processing of the individual parts as a whole, such as the bits of a character, characters of a word, and so on, using the same circuit facilities for processing the successive parts. Parallel interfaces, on the other hand, involve simultaneous processing of individual parts of a whole, using separate facilities for the various parts.

It is often necessary to convert serial data to parallel data and parallel data to serial data so that two apparatus can communicate digitally with one another. Digital Signal Processing (DSP) integrated circuits (ICs), for example, may have an internal parallel bus, but may communicate with other devices or circuitry in a serial data fashion. Therefore, serial to parallel and parallel to serial conversion must be performed so that serial data to and from other devices can be placed on and taken off of the DSP's internal parallel bus. Shift registers are generally used to make these conversions.

For example, a 16-bit serial to parallel port and a 16-bit parallel to serial port would consist of two 16-bit registers. One 16-bit register for the serial to parallel path and one 16-bit register for the parallel to serial path. Using two 16-bit registers for two separate circuits consumes both circuit space and power. Consequently, additional control circuitry must control each serial to parallel and parallel to serial data port so that they operate without locking up the data bus.

Furthermore, in a normal 8-bit serial to parallel and an 8-bit parallel to serial port having buffered 8-bit registers (two 8-bit registers for each parallel to serial and serial to parallel port). One register is used to latch inbound serial data. After the inbound serial data is received, the data is transferred to a buffer register so, for example, the microcode of the DSP IC could extract the data from the register in a parallel fashion. Double buffering mode allows microcode to access data during a later clock cycle. Similarly, a separate transmit or outbound register is used to shift 8-bit parallel data from a parallel bus. The register would buffer the outbound data from, for example, microcode so that the buffered register could hold and transfer the outbound data to an outbound register, which allows the outbound data to be shifted serially at the next timing frame onto the transmit serial bus.

The general 8-bit buffered serial to parallel circuit and parallel to serial circuits require two separate 8-bit registers connected to the parallel bus, one 8-bit register for each circuit. For example, if the parallel bus is internal to a DSP IC and the serial bus is external to the DSP IC, and outbound data is being transferred from the parallel internal bus to the external serial bus and inbound data is being transferred from the external serial bus to the internal parallel bus. Two separate data port circuits are required, one circuit for outbound data and a second circuit for inbound data. Each circuit has its own separate register connected to the internal parallel bus. Thus, circuit space and power are required for each of the inbound and outbound data port circuits.

Furthermore, if an internal parallel bus received and transmitted both linear data and pulse code modulated (PCM) data wherein the linear data is 16-bit data and the PCM data is 8-bit, according to the above discussion, four separate circuits would be required. One for inbound serial to parallel 16-bit linear data, a second for outbound parallel to serial 16-bit linear data, a third for inbound serial to parallel PCM 8-bit data, and a fourth for outbound parallel to serial PCM 8-bit data. The four separate circuits would each require circuitry space and power if all are placed within an electronic apparatus and, in particular, a DSP IC.

Thus, the above discussed normal architectures for inbound and outbound data are disadvantageous because they all require their own circuitry and power, they are not combined into a single circuit capable of handling both inbound and outbound n-bit linear data as well as inbound and outbound m-bit PCM data (where $m \leq n$).

SUMMARY OF THE INVENTION

An object of the present invention is to provide a data I/O port capable of being bidirectional and changing parallel data to serial data and serial data to parallel data.

It is a further object of the present invention to provide a data I/O port which transmits and receives data through the same registers.

It is a further object of the present invention to provide a data I/O port which can operate selectively in a linear mode or a buffered mode.

It is a further object of the present invention to provide a data I/O port which allows a circuit using a parallel bus to communicate serially to a variety of peripheral devices.

It is a further object of the present invention to provide data I/O port circuitry which requires a minimum of circuit space in an IC or other circuit and furthermore requires a minimum of power to operate.

Accordingly, these objects and others which would be comprehensible to one skilled in the art are accomplished by providing a data I/O port for connecting a serial data bus with a parallel data bus having an interface register interfacing a parallel data bus with transmit and receive serial data buses. The interface register operates to receive data through the data port by shifting serial receive data into the interface register and latching the data onto the parallel bus. Simultaneously, the interface register also latches transmit data from the parallel bus and shifts the transmit data onto the transmit serial data bus.

The same circuitry, described above, is combined with an inbound, outbound, and temporary register which provide a buffered mode of operation. The buffered mode serially shifts receive data from a receive serial data bus into the inbound register within a predetermined time frame. During the same time frame transmit data from the parallel bus is serially shifted onto a serial output bus by the outbound register. Receive data and transmit data are buffered and serially shifted in a circular shifter comprised of the interface register and the temporary register. The temporary register passes receive and transmit data in a parallel fashion from and to the inbound and outbound registers, respectively. The interface register passes receive and transmit data in a parallel fashion to and from the parallel data bus. Meanwhile, transmit data is circularly passed from the interface register to the temporary register while, receive data is circularly passed from the temporary register to the interface register. The result is a buffered data I/O port capable of simultaneously propagating transmit and receive data through the same registers so that a minimum number of registers, overall circuitry and power is required.

BRIEF DESCRIPTION OF THE DRAWINGS

These and other objects and advantages of this invention will become apparent and more readily appreciated from the following description taken in conjunction with the accompanying drawings, of which.

DETAILED DESCRIPTION OF THE PREFERRED EXEMPLARY EMBODIMENT

The following detailed description addresses a preferred embodiment of the present invention. Those having skill in the art will readily recognize that there are many possible embodiments of the invention which may be employed in a wide variety of instances and under various conditions. The following detailed description primarily addresses the preferred embodiment in an application to time division multiplexed (TDM) communication systems conforming to the CT2 standard. Those having ordinary skill in the art will, nevertheless, appreciate and recognize that alternative applications, aspects and embodiments of the invention are possible. All those other applications, aspects and embodiments are hereby expressly included in and form a part of the invention.

Generally, the invention, in one embodiment, includes apparatus and methods for sending and receiving X-bit serial data to and from an X-bit parallel bus as well as sending and receiving Y-bit serial data, in a buffered fashion, to and from the X-bit parallel bus, Y being less than or equal to X. The transfer of both X and Y-bit data is performed in the same registers of a single data input/output port circuit.

The preferred embodiment of the present invention, an input/output data port, is incorporated into a digital signal processing (DSP) integrated circuit (IC). The input/output port of the present invention allows an internal parallel bus of the DSP IC to process 8-bit data, being for example 8-bit A-law PCM and/or 8-bit u-law PCM data; 4-bit data, being for example 4-bit ADPCM data; and 16-bit data, being for example, 16-bit linear data through the same input/output data port without requiring extensive extra circuitry to accommodate the various data formats. This flexibility allows a DSP IC to interface with many different other DSP processors and ICs. The inventors note that this input/output port is not limited to use within a DSP IC, but can also be used in microprocessors, general I/O circuitry and a wide variety of peripheral IC's and circuits. Furthermore, the inventors recognize that the present invention can interface a parallel bus of X-bits, X being any positive non-zero integer, to various types of serial data buses.

The preferred exemplary embodiment of the present invention is part of a multi-coded DSP which is implemented as an integrated circuit (IC). The multi-coded DSP can include A-law, u-law, PCM, and linear encoded data which are transmitted and received by the DSP through a data port representative of the present invention input/output data port.

Figure 1:
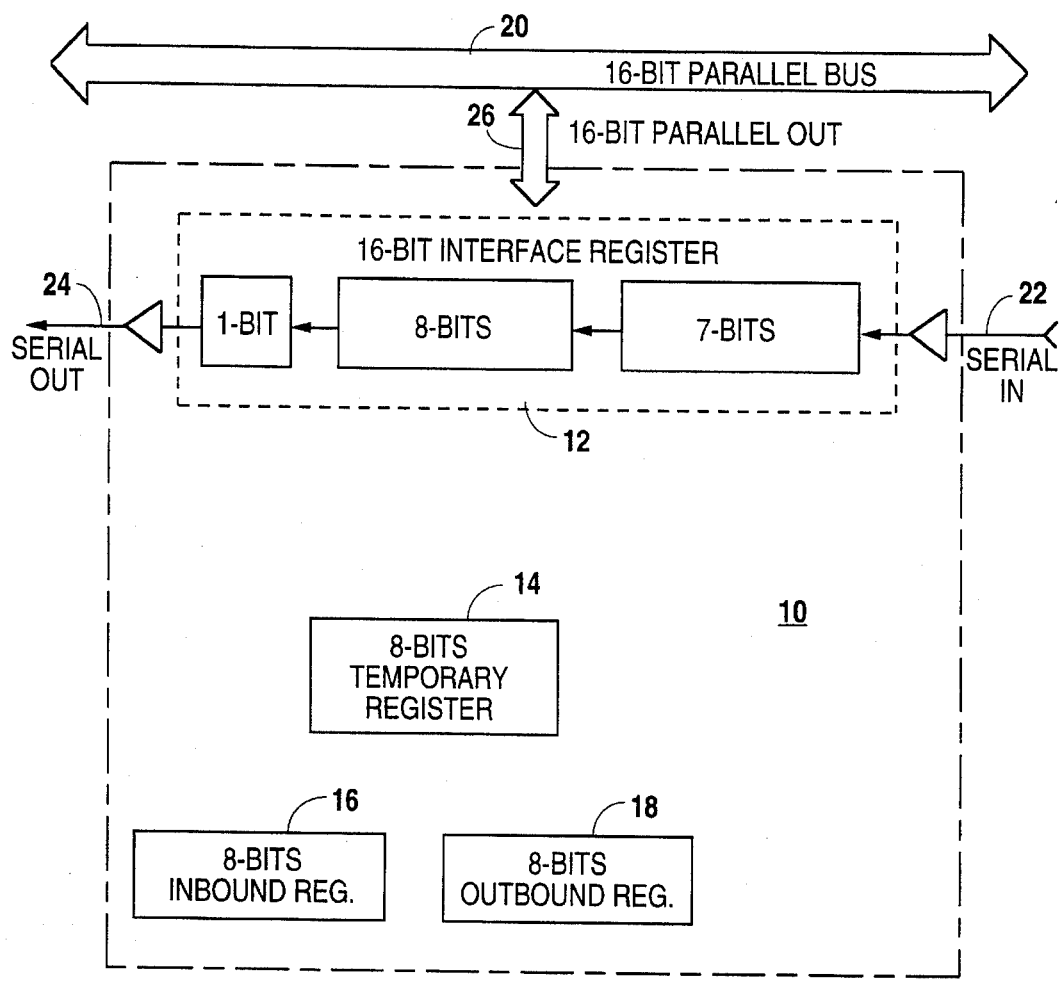
FIG. 1 is a block diagram of an embodiment of the present invention in linear mode.
Figure 2:
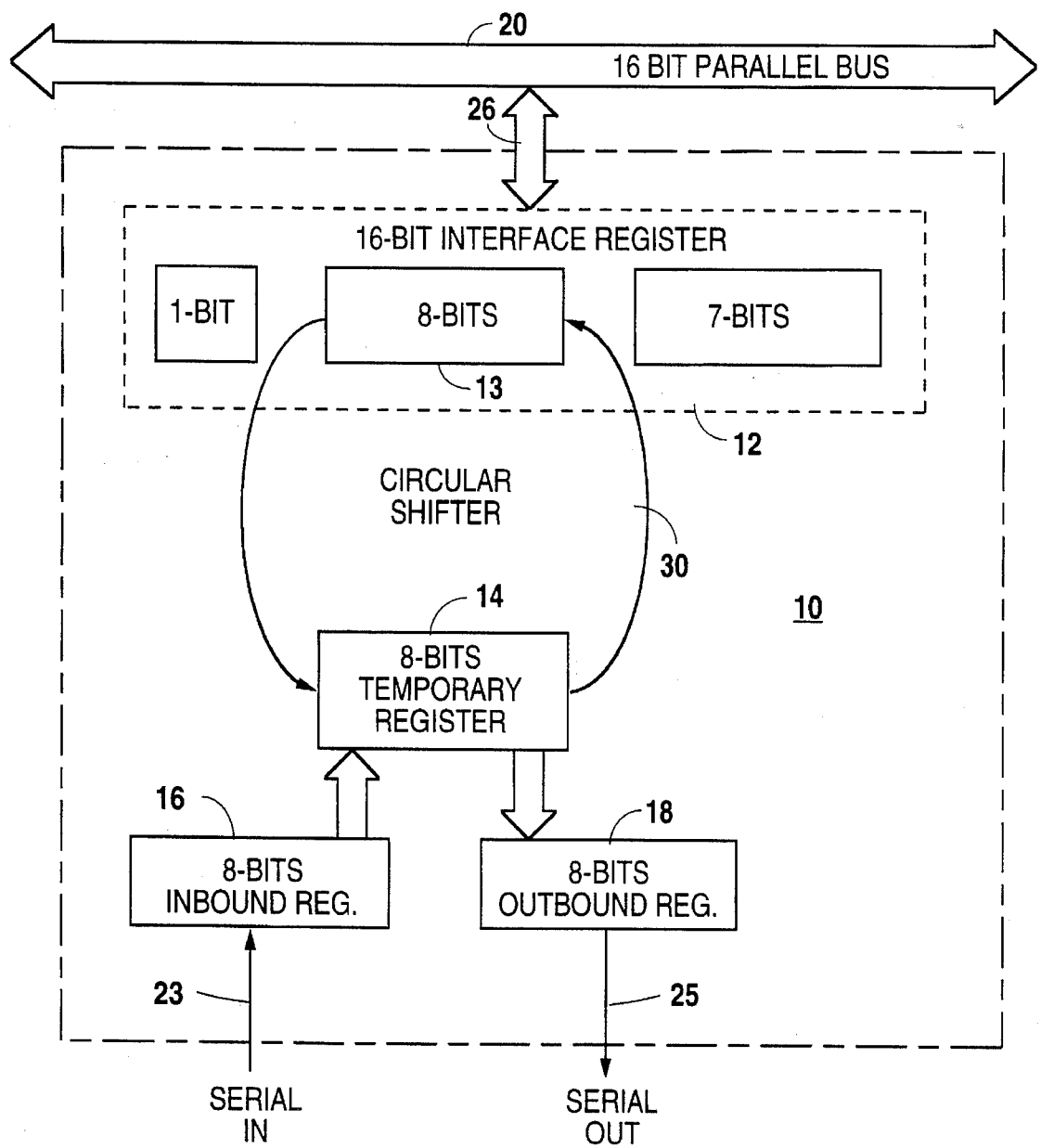
FIG. 2 is a block diagram of an embodiment of the present invention in buffered mode.
Figure 3:
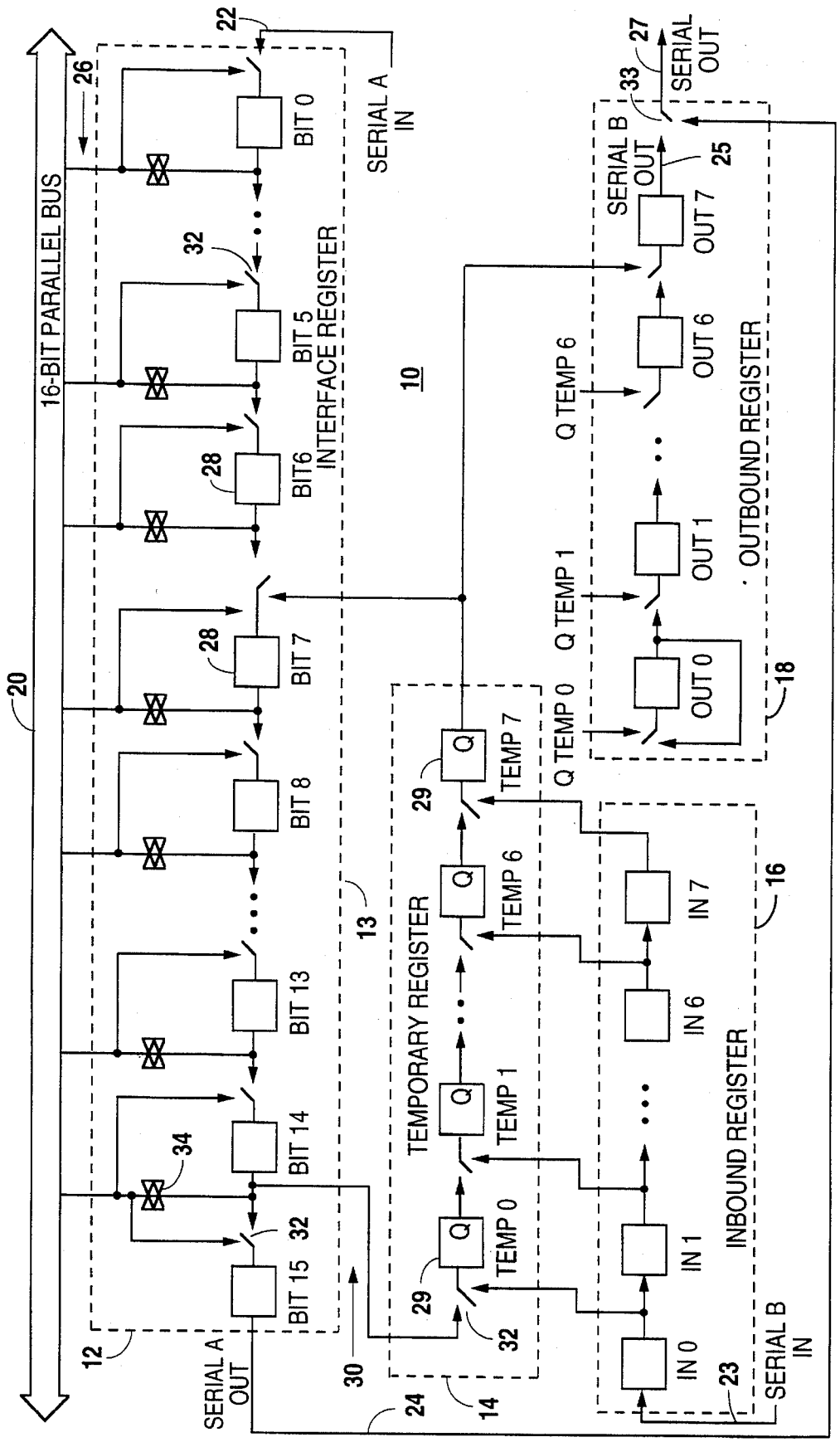
FIG. 3 is a general block diagram of the flip-flop/register arrangement of the present invention.

Referring to FIGS. 1, 2 and 3 the input/output data port (I/O data port) 10 of the preferred exemplary embodiment comprises a 16-bit interface register 12, and three 8-bit registers which include a temporary register 14, an inbound register 16 and an outbound register 18.

There are two preferred modes of operation; the 16-bit linear mode and the 8-bit buffered mode.

Referring first to the 16-bit linear mode, depicted in FIG. 1, serial data can be shifted serially into the 16-bit interface register via a serial-in-bus 22. The serial data is inbound to the I/O data port 10 and considered to be "receive data" with respect to a parallel bus 20. Also, parallel data can be shifted in a parallel fashion from the parallel data bus 20 to the interface register 12 and then shifted serially out the serial-out-bus 24. Here, the parallel data is considered outbound to the serial out bus 24 and "transmit data" to the parallel data bus 20. Both transmit data and receive data propagate through interface register 12.

Referring now to the 8-bit buffer mode depicted in FIG. 2, the 16-bit interface register 12 is can be converted via a program, software, firmware, hardware, a flip-flop transfer gate, a mux control, etc., explained in more detail below, into a 8-bit interface register 13 that performs parallel to serial and serial to parallel transfers. It is understood that the interface register can be converted into an interface register having less than or equal to the number of flip-flops in the interface register 12. Sixteen flip-flops are being used in the preferred embodiment for interface register 12.

The temporary register 14, inbound register 16 and outbound register 18 are all 8-bit registers in this embodiment and are only used in the 8-bit buffer mode. The inbound register 16 converts receive data inbound from a serial-in-bus 2-3 from serial to parallel. The received data is shifted in a parallel fashion to the temporary register 14. The received data is then serially shifted to the 8-bit interface register 13, and then is parallel shifted to the parallel data bus 20.

At the same time inbound receive data is being shifted from the serial-in-bus 23 to the parallel data bus 20, outbound, transmit data is being shifted from the parallel data bus 20 to the B-bit interface register 13, and then serially shifted to the temporary register 14. From the temporary register 14, the transmit data is sent parallel to the outbound register 18 where it is serially shifted onto the serial-out-bus 25.

In FIG. 3 a block diagram of the flip-flop/register arrangement of the I/O data port 10 is shown. Both the linear mode and buffer mode of operation are explained in more detail with respect to FIG. 3 below.

Figure 6A:
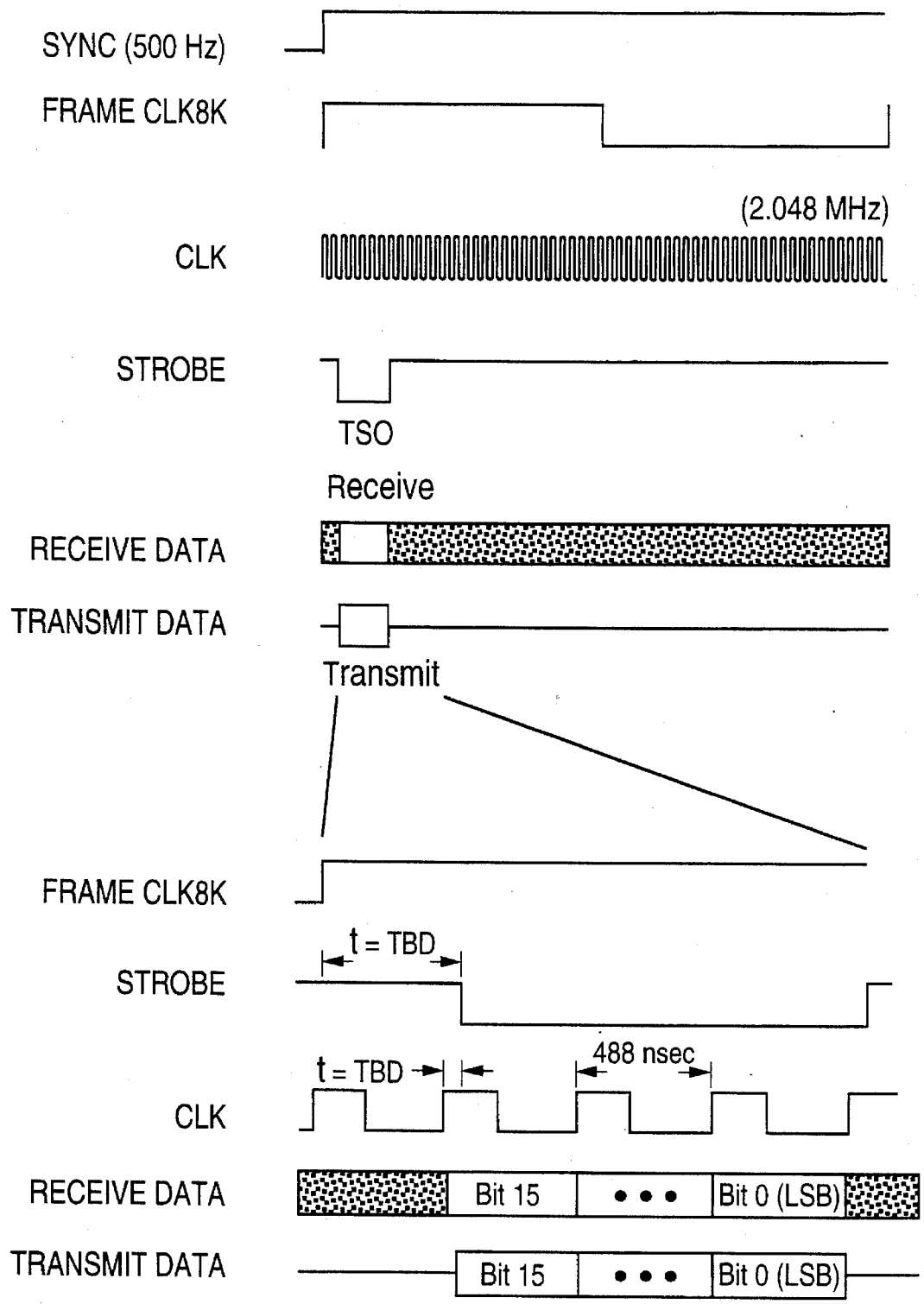
FIGS. 6A and 6B are timing diagrams of the present invention in linear mode.
Figure 6B:
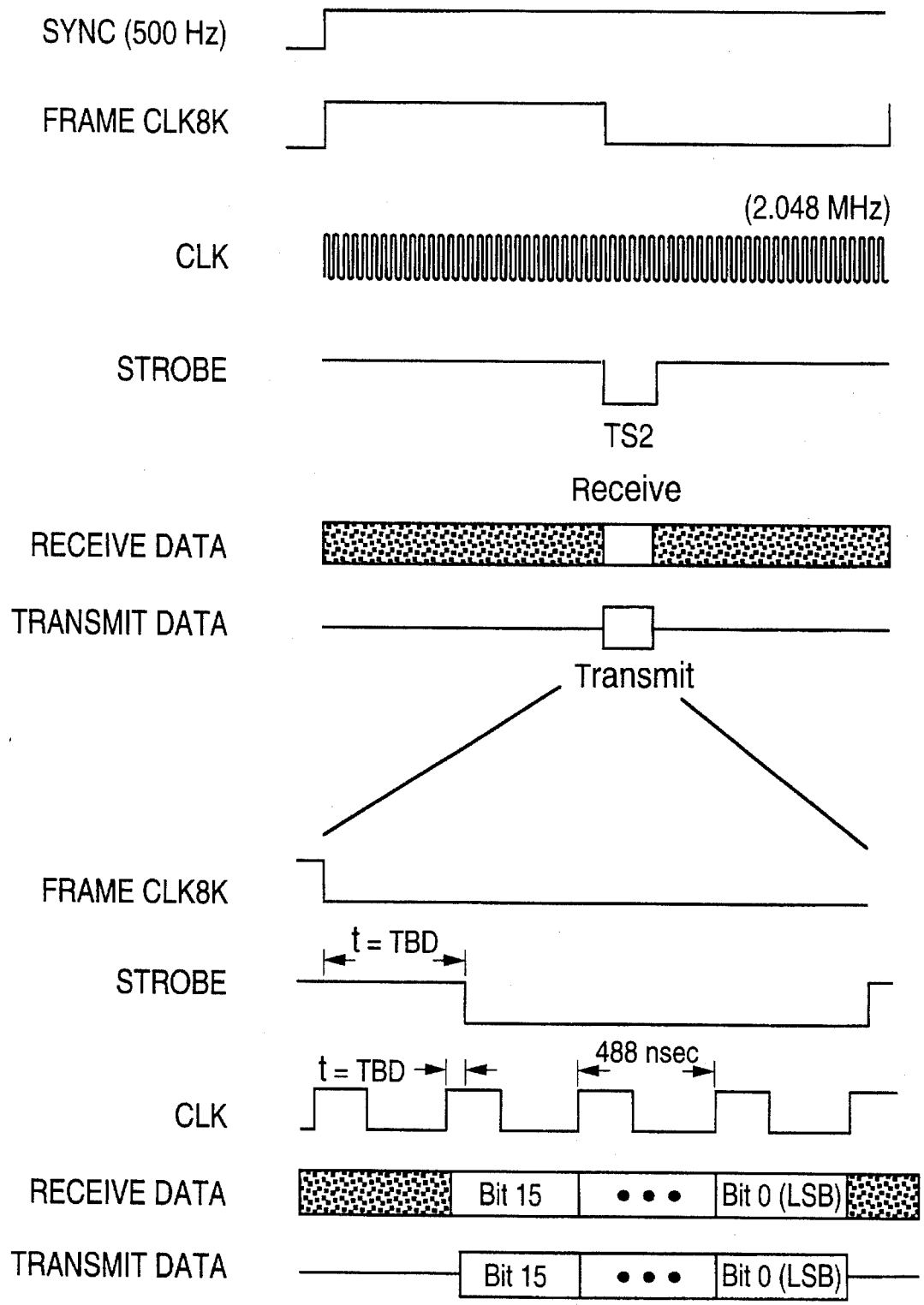

In linear mode, transmit data, outbound from the parallel data bus, is shifted from the parallel data bus 20 into the interface register 12 and held in the master portion of each of the register's master/slave flip-flops 28 for bits 0 to 15. The transmit data is shifted to the serial-out-bus 24 during a time slot strobe (FIGS. 6A and 6B). During the time slot, receive data is serially shifted from serial bus 22, most significant bit first, and into the master/slave flip-flops 28. It is understood that the data can also be shifted least significant bit first. After the time slot strobe, the receive data is held in the slave portion of each of the register's master/slave flip-flops 28 for bits 0–15.

In this preferred embodiment there are 16 master/slave flip-flops 28 in the interface register 12. The receive data is shifted from the bit-0 register to the bit-15 register and then shifted in a parallel fashion to the parallel bus 20. FIGS. 6A and 6B, are timing diagrams for the linear mode. As shown in FIGS. 6A and 6B, both transmit and receive functions are triggered by the leading edge of the strobe signal TS0 or TS2. TS0 and TS2 can occur in the same frame to use the present invention as an echo port I/O. Furthermore, as also shown in FIG. 3, both transmit data and receive data propagate through the same flip-flops 28 in the interface register 12.

The preferred embodiment input/output data port 10 requires only one 16-bit register to transmit 16-bit data from the parallel data bus 20 and receive 16-bit data from the serial-in-bus 22. Furthermore, the input/output data port transfers transmit and receive data simultaneously through the same flip-flops 28. Thus, the present invention uses less logic circuitry and power than previous circuits and can move data continuously without having to wait for the port to change from an input port to an output port. The present invention I/O data port 10 operates as both an input and output port simultaneously.

The inventors note that linear mode can accommodate linear sign extended data which carries a sign bit. The interface data register of the preferred embodiment is configured to accommodate the sign bit by duplicating the sign bit (shown at bit-15).

Figure 7:
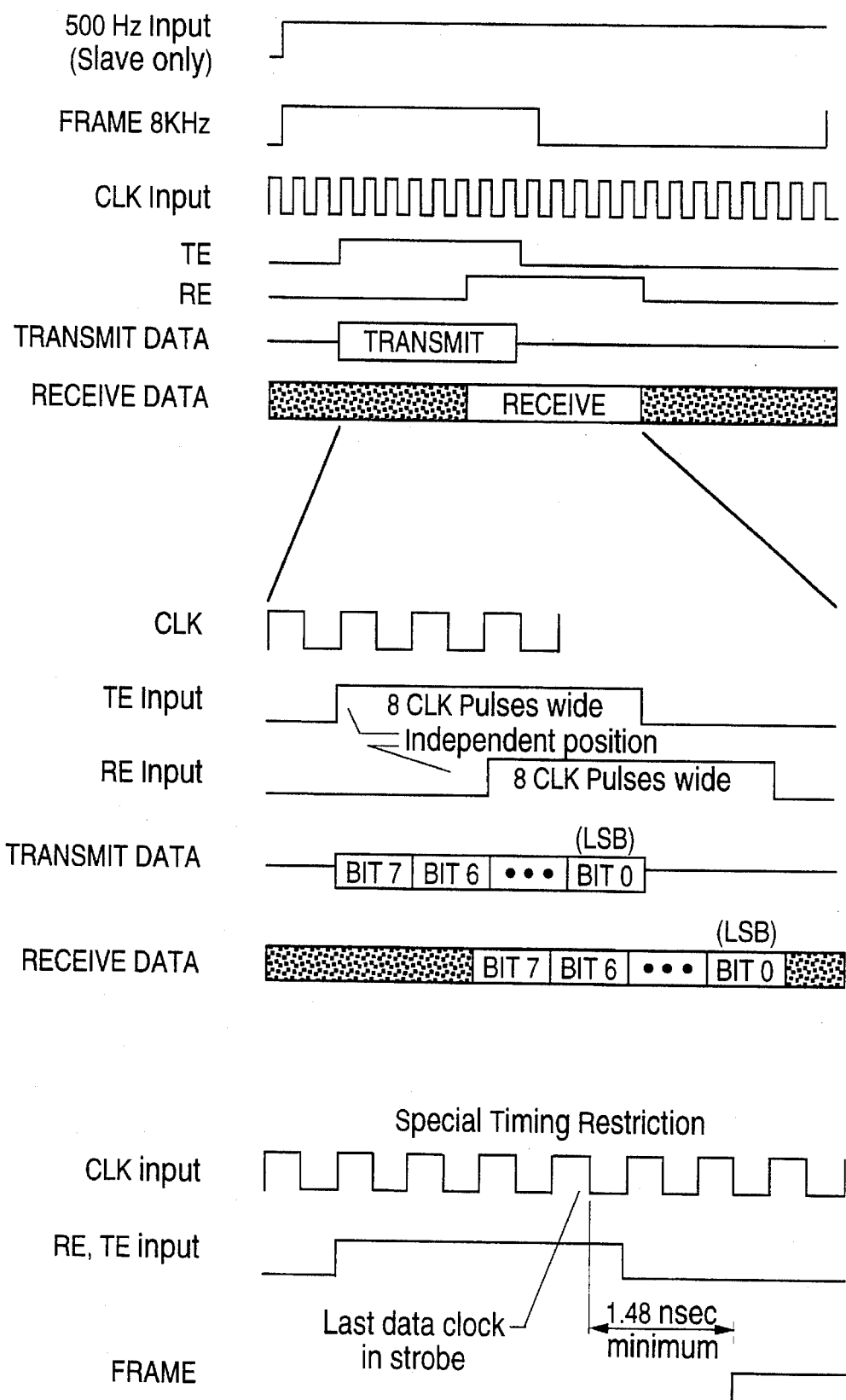
FIG. 7 is a timing diagram of the present invention in buffered mode.

FIGS. 3 and 7 illustrate the buffer mode of operation of the I/O data port 10. A frame is a single 8 Khz clock period. Inside a frame 8-bits of serial data are shifted into inbound register 16 during a data receive time slot (RE). Inbound, receive data can be shifted into inbound register 16 at various frequencies. The preferred embodiment inbound, receive data frequencies include 64, 128, 256, 512, 1024 and 2048 KHz. It is understood that the frequency can be a frequency above 64 KHz. At the end of the frame, the receive data is latched in parallel to the master portion of the temporary register flip-flops 29 (bits 7–14). A circular shift occurs causing receive data to be shifted from the temporary register 14 to the interface register 12. Once the inbound, receive data is in the interface register 12, the parallel data bus 20 has access to the receive data. In the preferred embodiment the microcode, associated with the DSP IC uses the received data placed on parallel data bus 20.

Transmit data is placed on the parallel data bus 20 near the end of the frame. The DSP microcode directs the interface register 12 to latch the transmit data into its flip-flops 28. A circular shift takes place which serially shifts the transmit data to the slave portion of temporary register 14. At the end of the frame, when inbound, receive data is latched into the temporary register 14, the transmit data is also latched in parallel fashion to the outbound register 18 from the temporary register 14. The transmit data is then serially transmitted out the serial-out-bus 25 by the outbound register 18 during a transmit time slot (TE). RE and TE are independent time slots although each occurs in a frame and are, preferably, active for 8 clock (CLK) cycles. Preferably, TE and RE are synchronized to an 8 KHz time frame and do not span the rising edge of an 8 KHz sync pulse.

Both the receive data and transmit data are buffered by the temporary register 14. Furthermore, both transmit and receive data are processed simultaneously by the circular shifter 30 which comprises the 8-bit portion of the interface register 13 and the temporary register 14.

Between the flip-flops 28 in the interface register 12 and temporary register 14 is a switching mechanism or mux 32 that is set by control logic 40 so that the I/O data port can be placed in either linear or buffer mode. That is, the mux 32 will switch so that the interface register 12 will work alone or will cooperate with the temporary register 14 in order to form a circular shifter.

Inbound, receive data, and outbound, transmit data are thus transferred simultaneously by the same registers in a single frame. It is preferred that there are two circular shifts within a frame so that inbound and outbound data will not be delayed.

Transfer gates 34 are located between each flip-flop of interface register 12 and the parallel data bus 20. When a transfer gate 34 is turned "on" data can be latched from the associated interface register flip-flop 28 to the parallel data bus 20. In other words, the transfer gates 34 allow the latched data from the interface register 12 to be driven onto the parallel data bus 20, as described above.

It is understood that the parallel data bus may be wider (have more parallel bits) than the number of interface register flip-flops being used when the I/O data port is in buffer mode. The preferred embodiment latches to only eight of the 16 available parallel data bus lines. It is further understood that more or less than eight interface register flip-flops can be used.

FIG. 3 also depicts a mux or switching device 33 (serial mux) for configuring the linear mode serial-out-bus 24 and the buffer mode serial-out-bus 25 to output to general serial-out-bus 22.

The buffer mode reuses the interface register hardware (of the linear mode) thereby eliminating the necessity of extra hardware. Circuitry costs are lowered, less IC real estate is needed and power consumption of the overall IC or circuit is lowered. Conversion of the 16-bit interface register 12 to an 8-bit interface register requires at least one mux 32 and the space to route signal lines (serial in, serial out, and two control signal for switching the mux).

Figure 4:
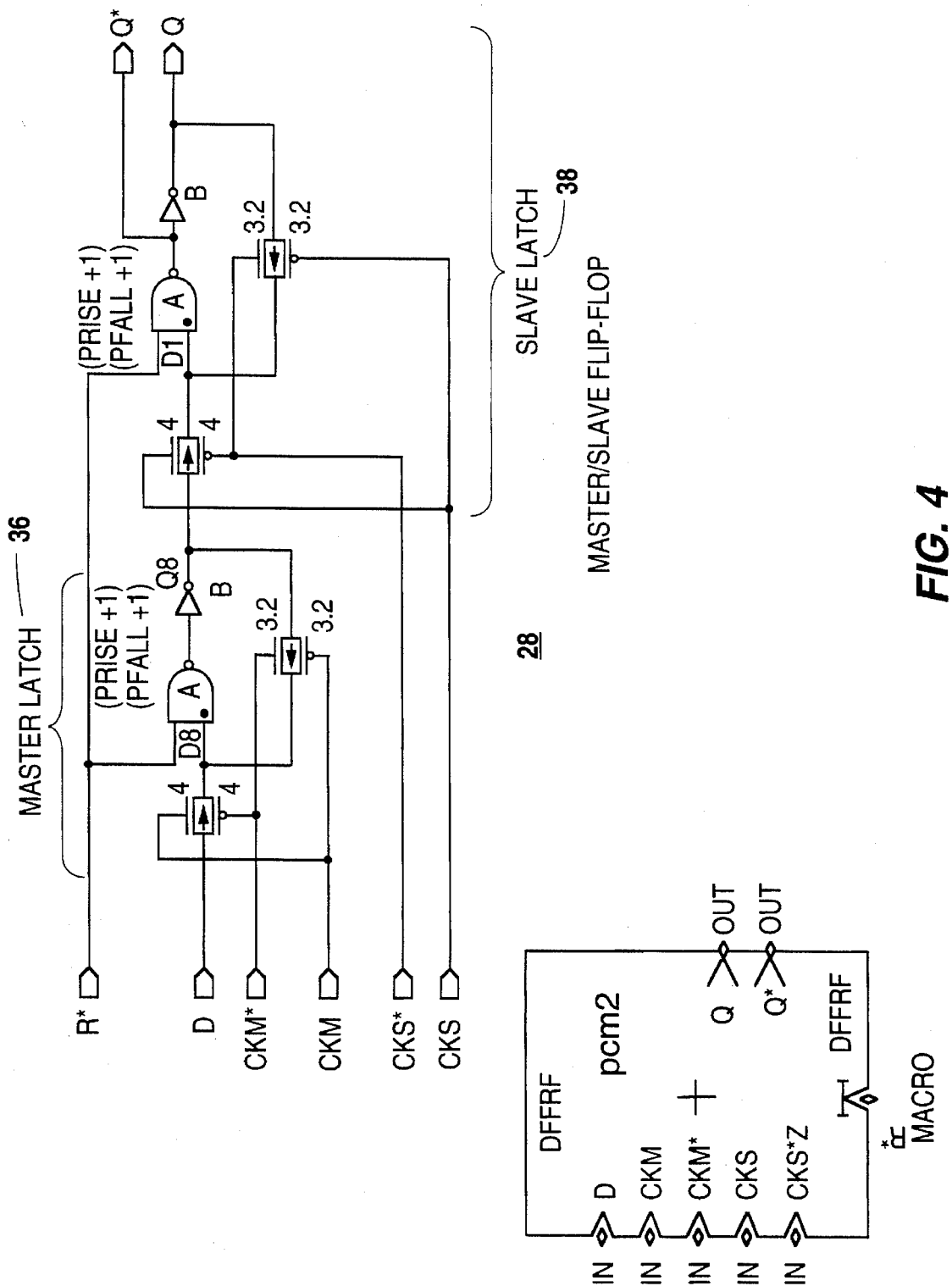
FIG. 4 is a schematic diagram of a preferred embodiment of a flip-flop.
Figure 5A:
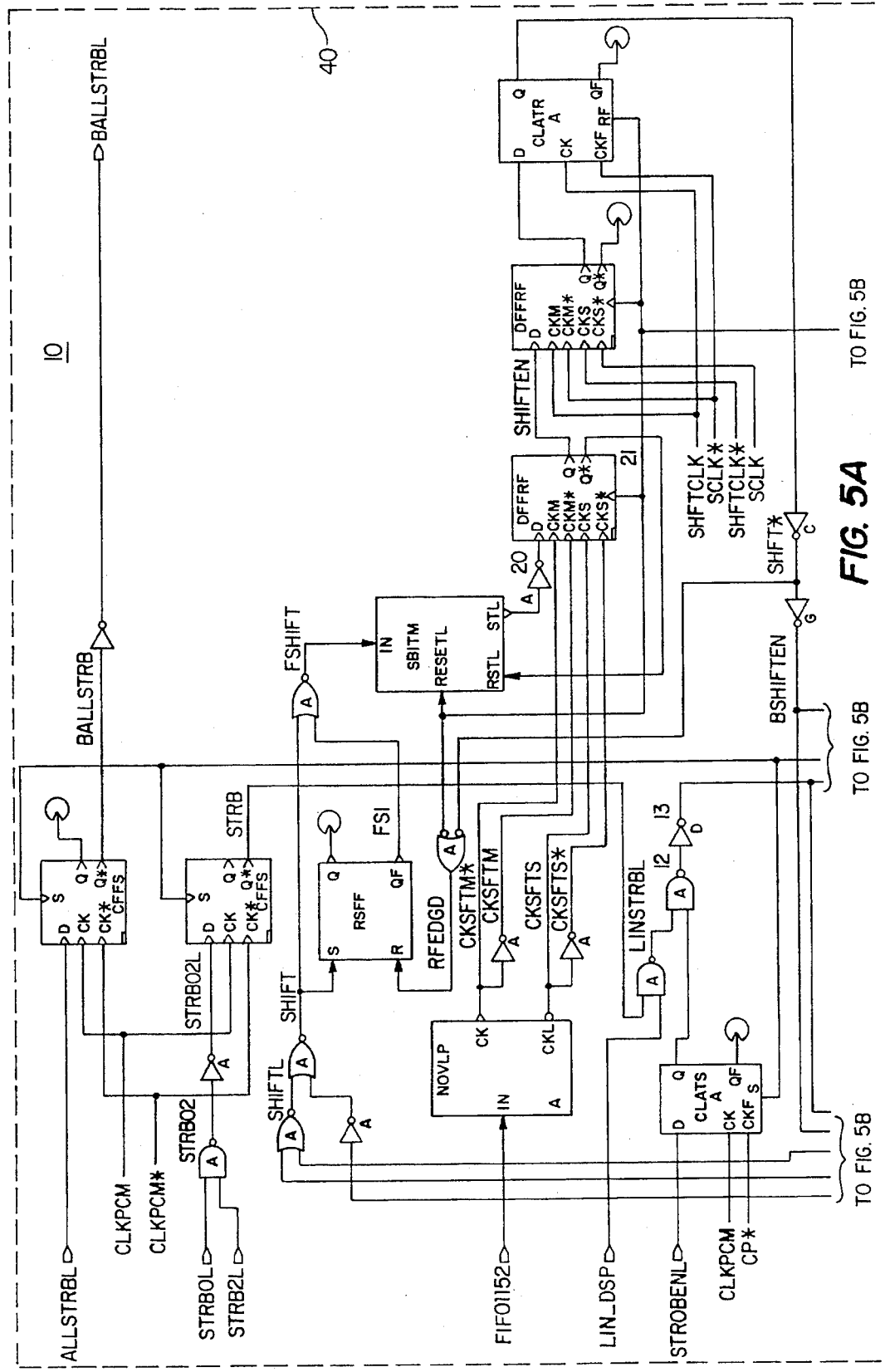
FIG. 5 is a schematic diagram of a preferred exemplary embodiment of the present invention.
Figure 5B:
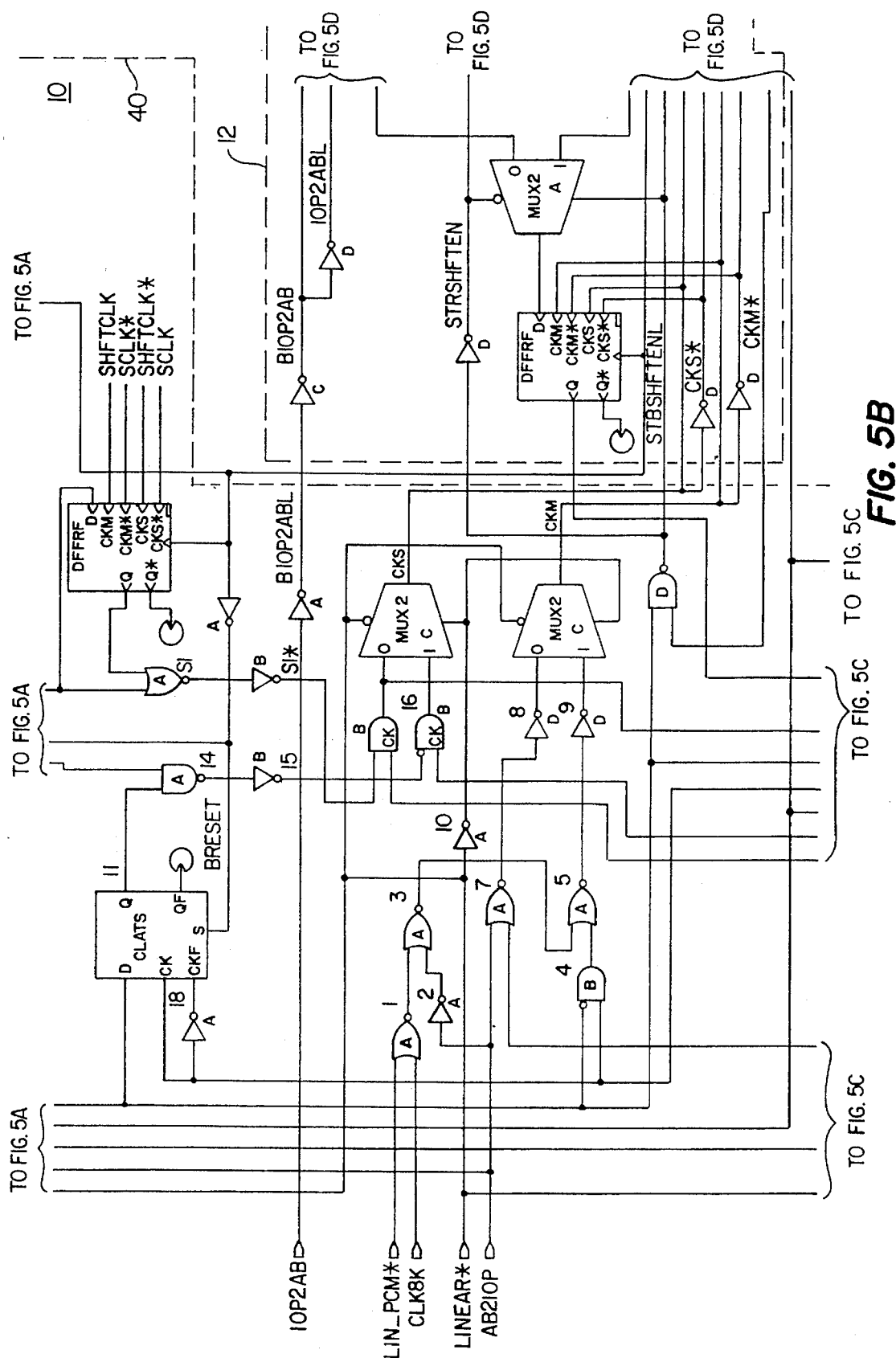
Figure 5C:
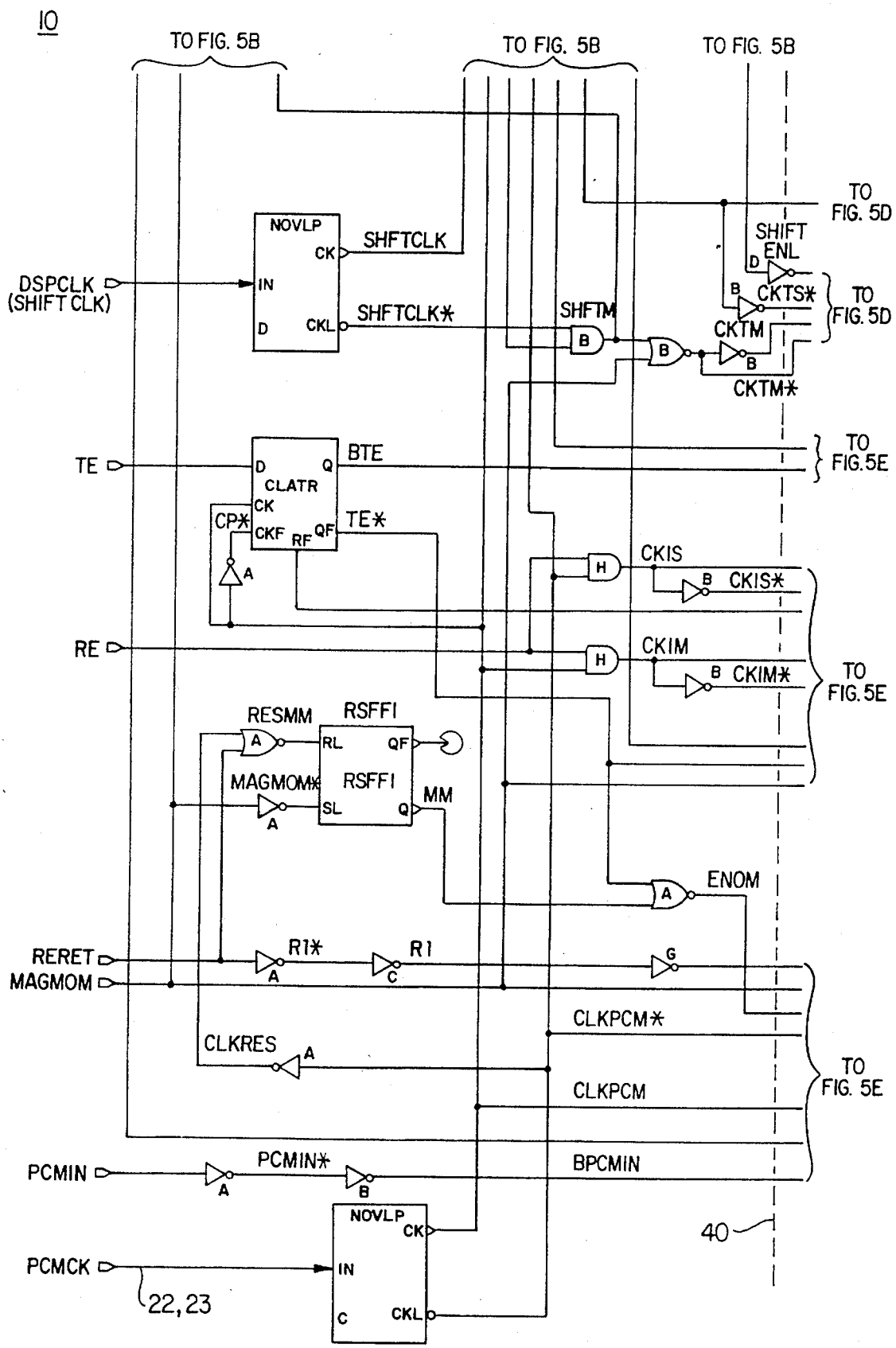
Figure 5D:
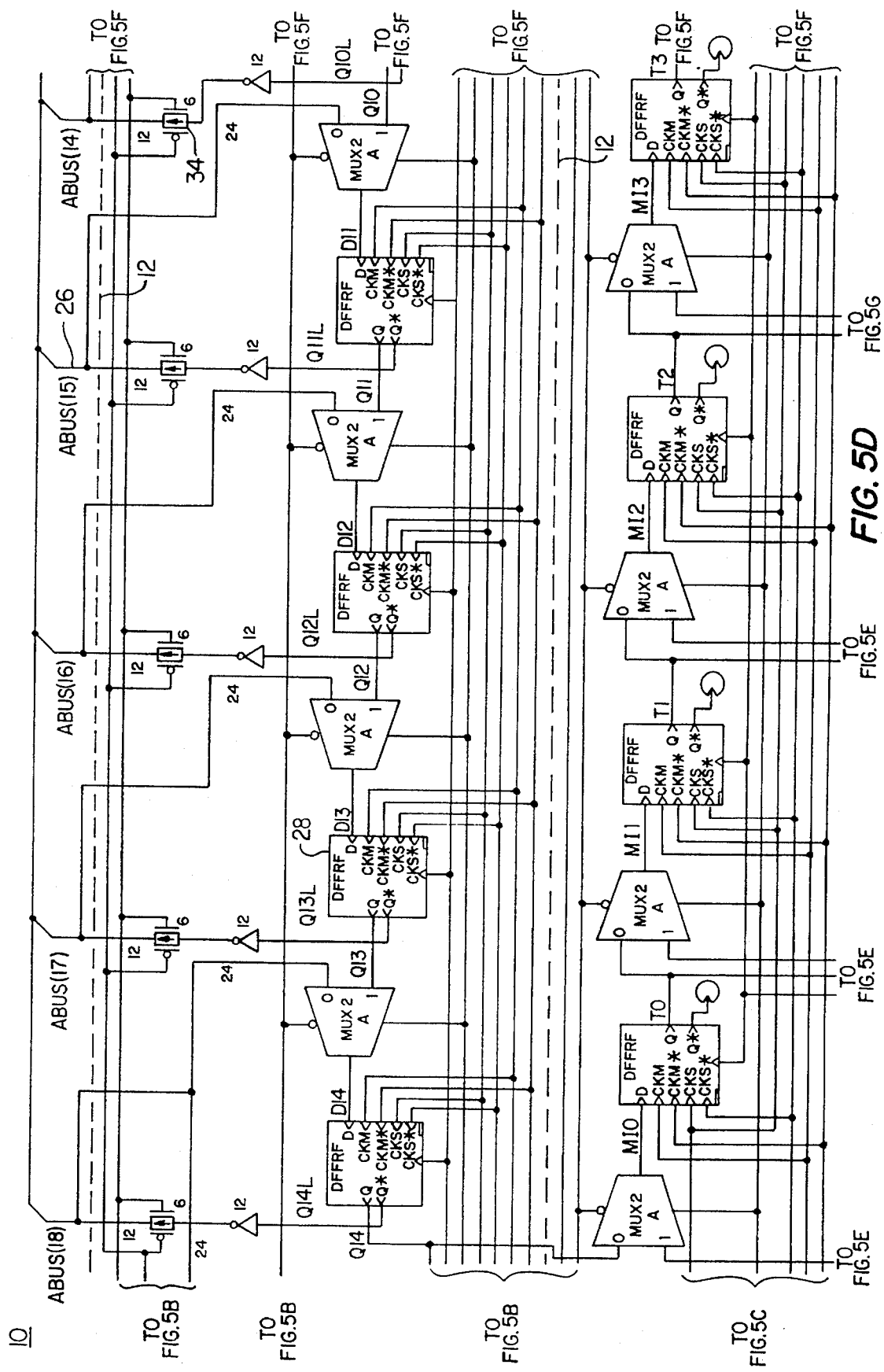
Figure 5E:
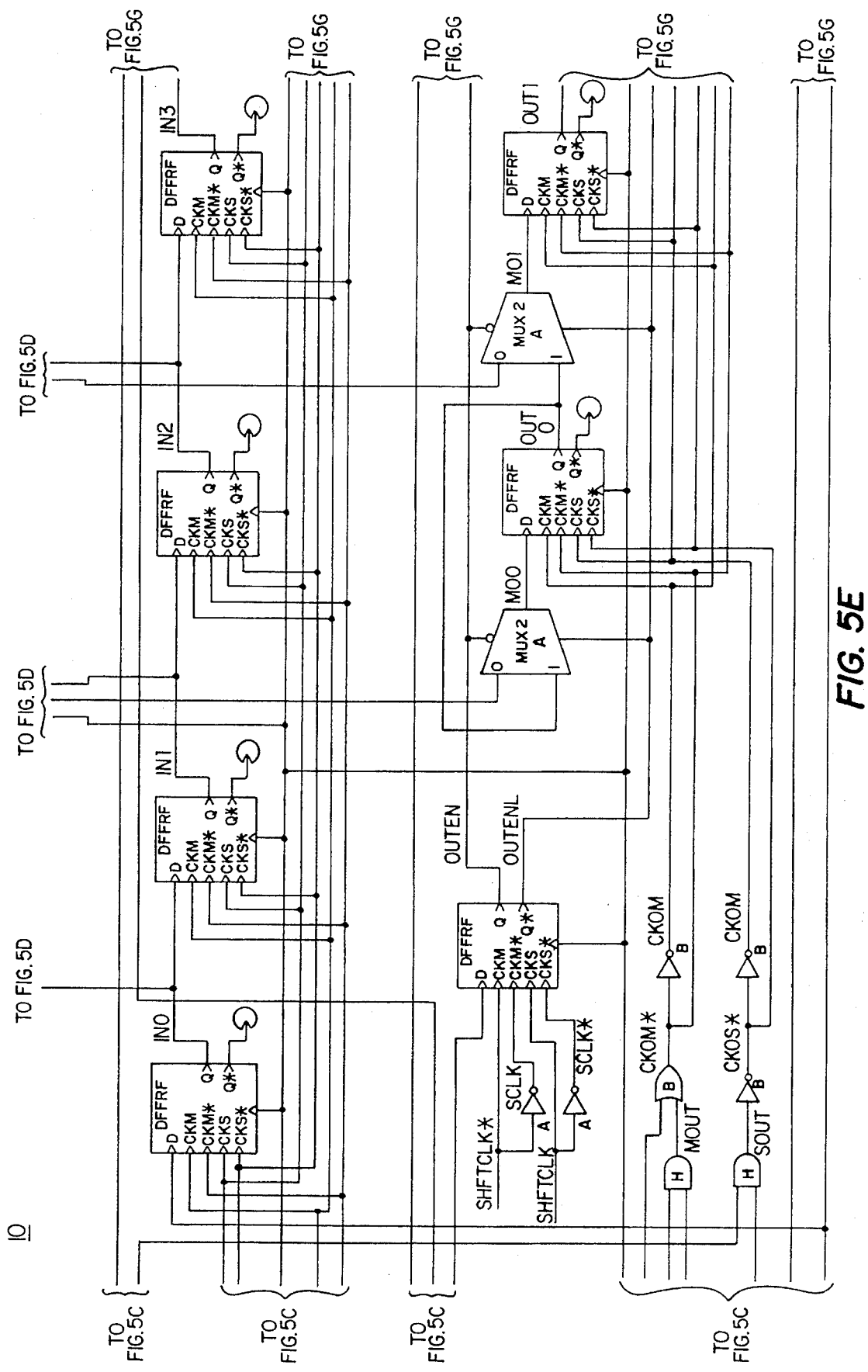
Figure 5F:
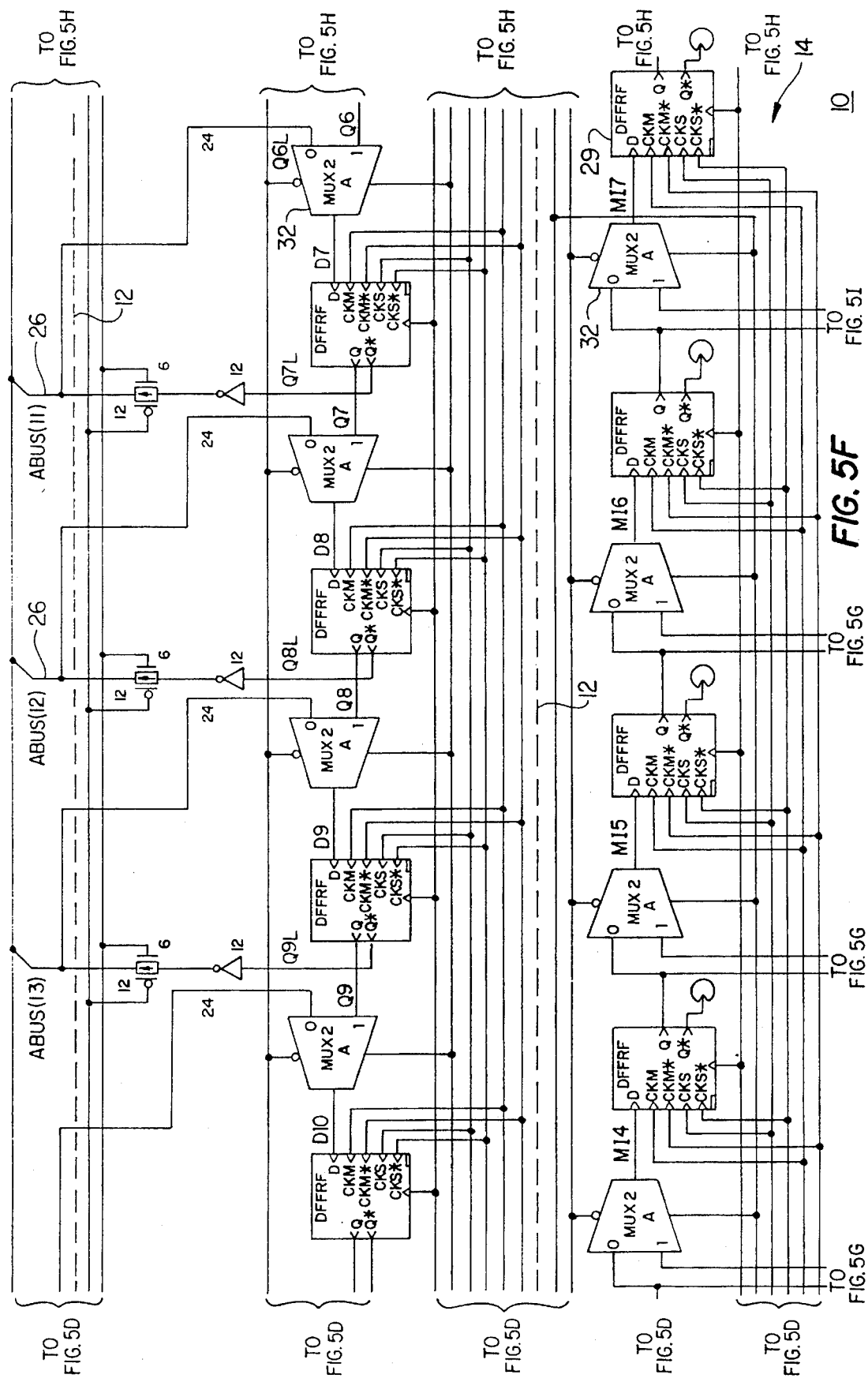
Figure 5G:
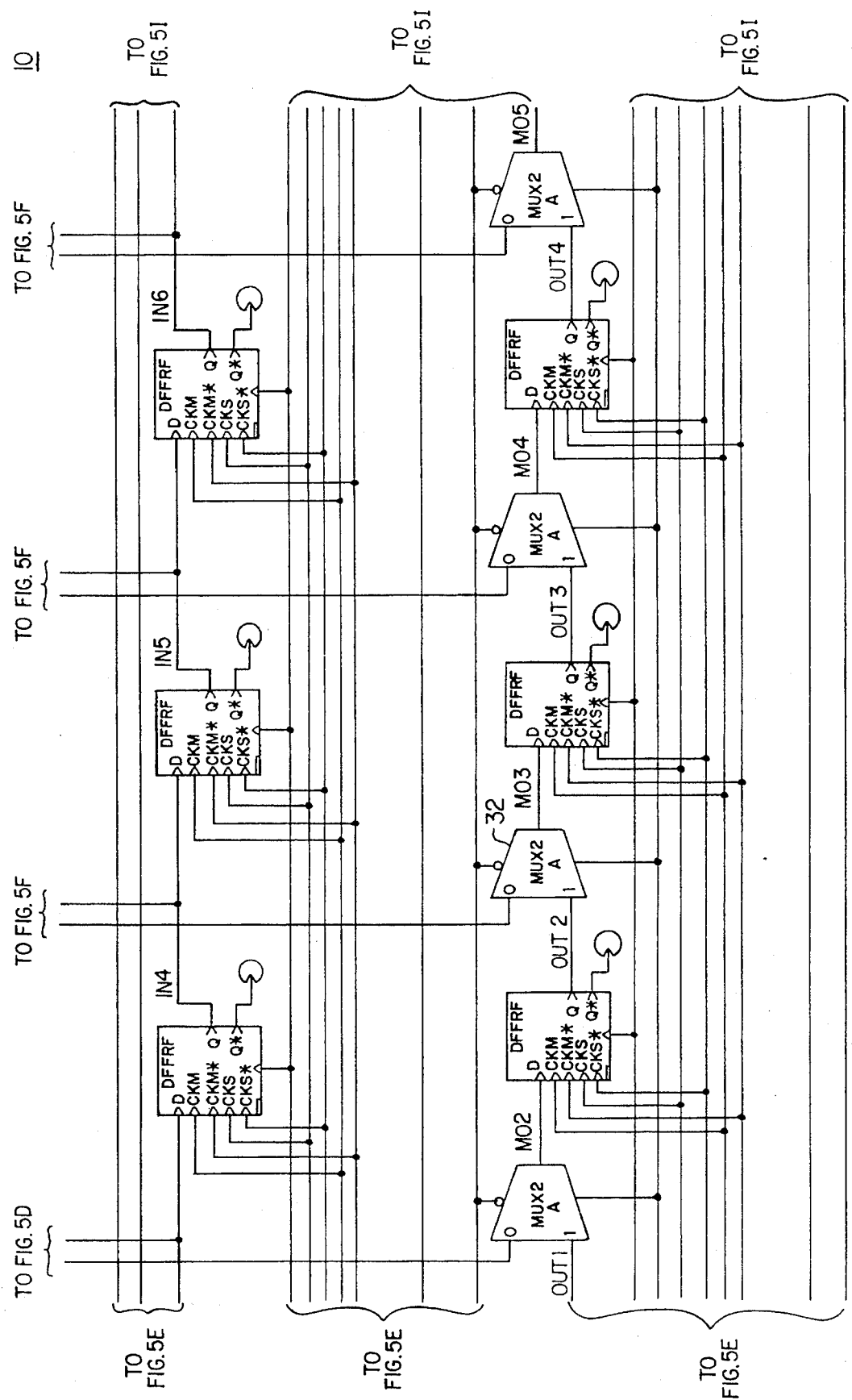
Figure 5H:
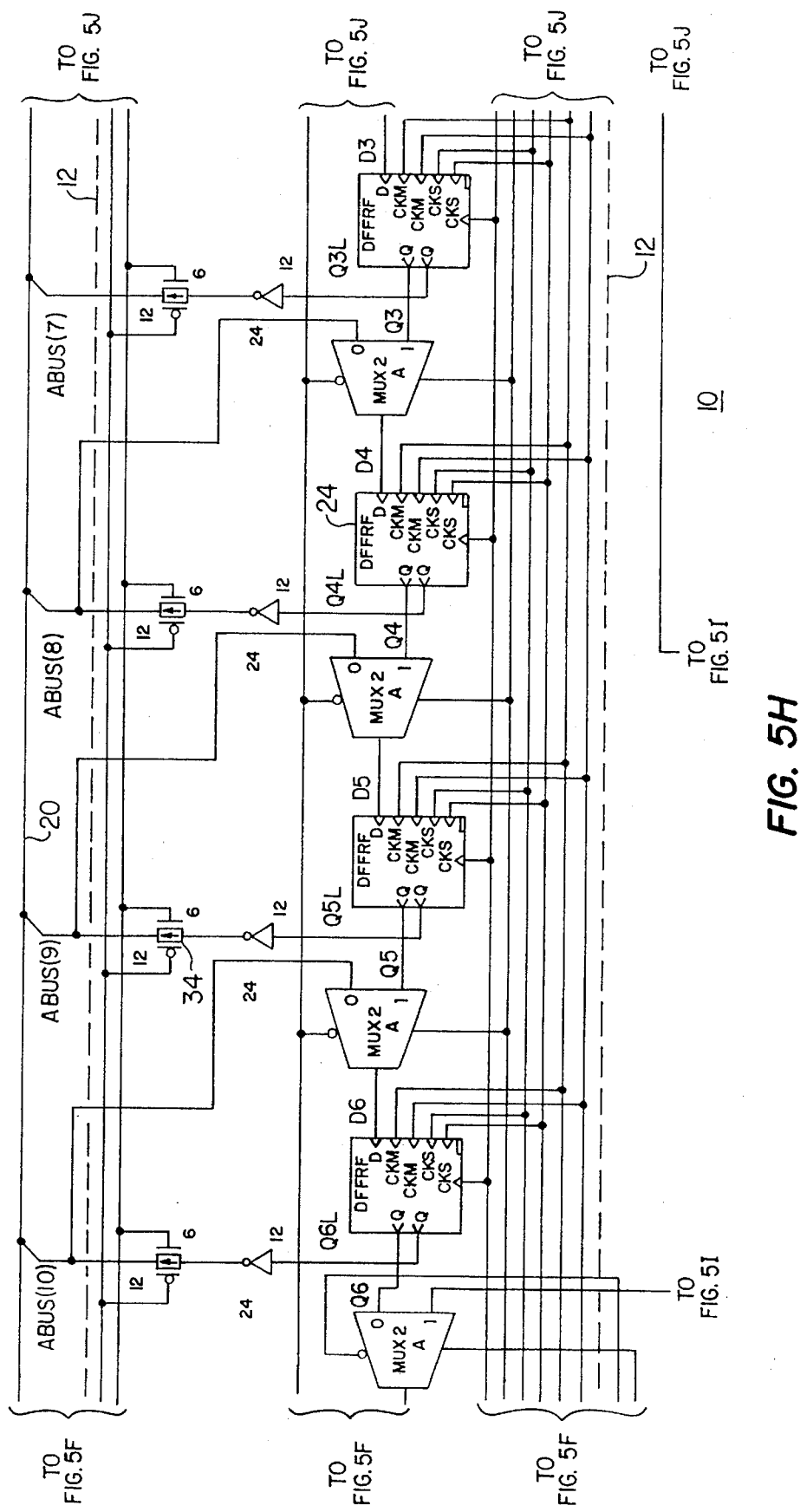
Figure 5I:
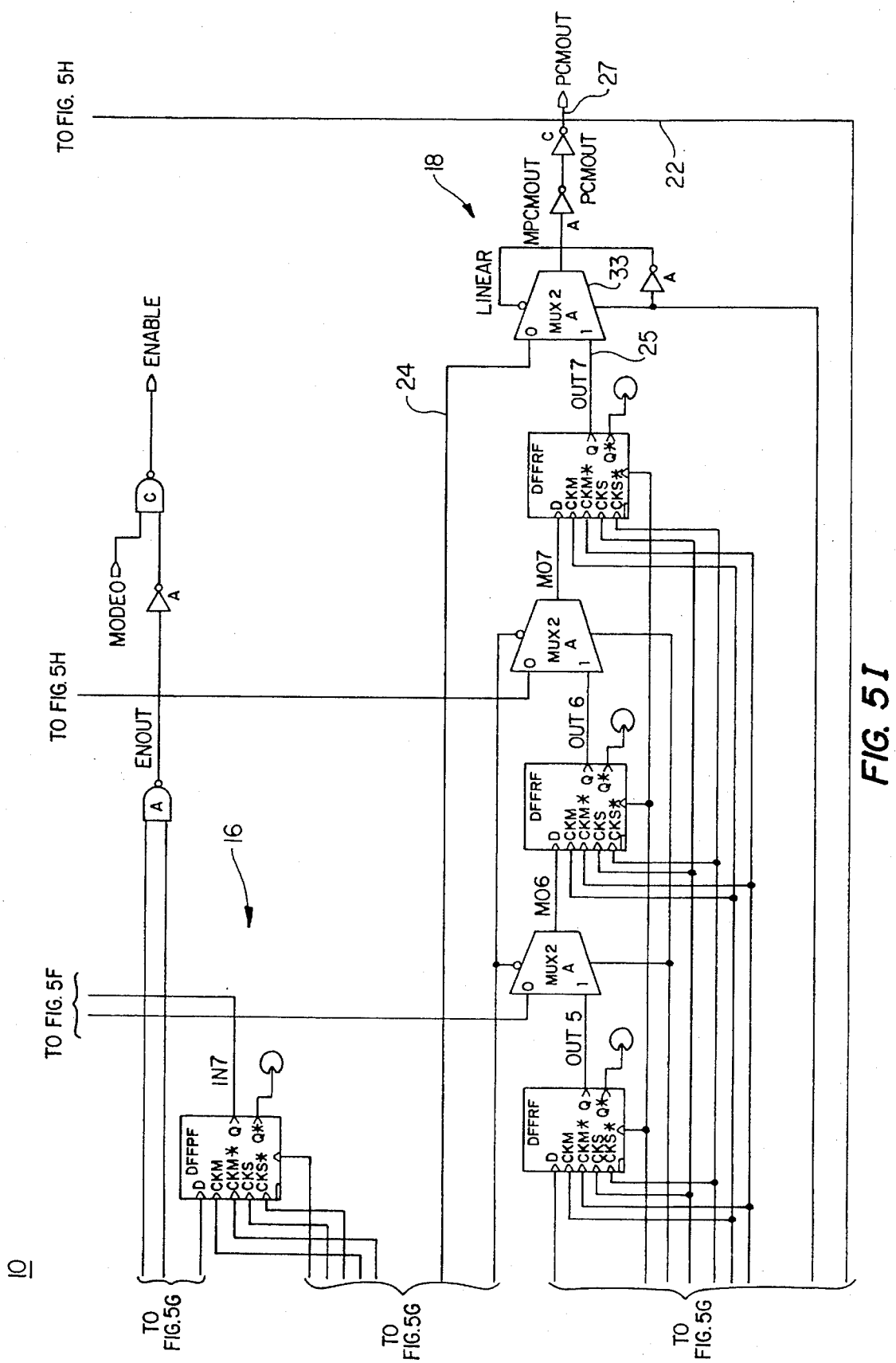
Figure 5J:
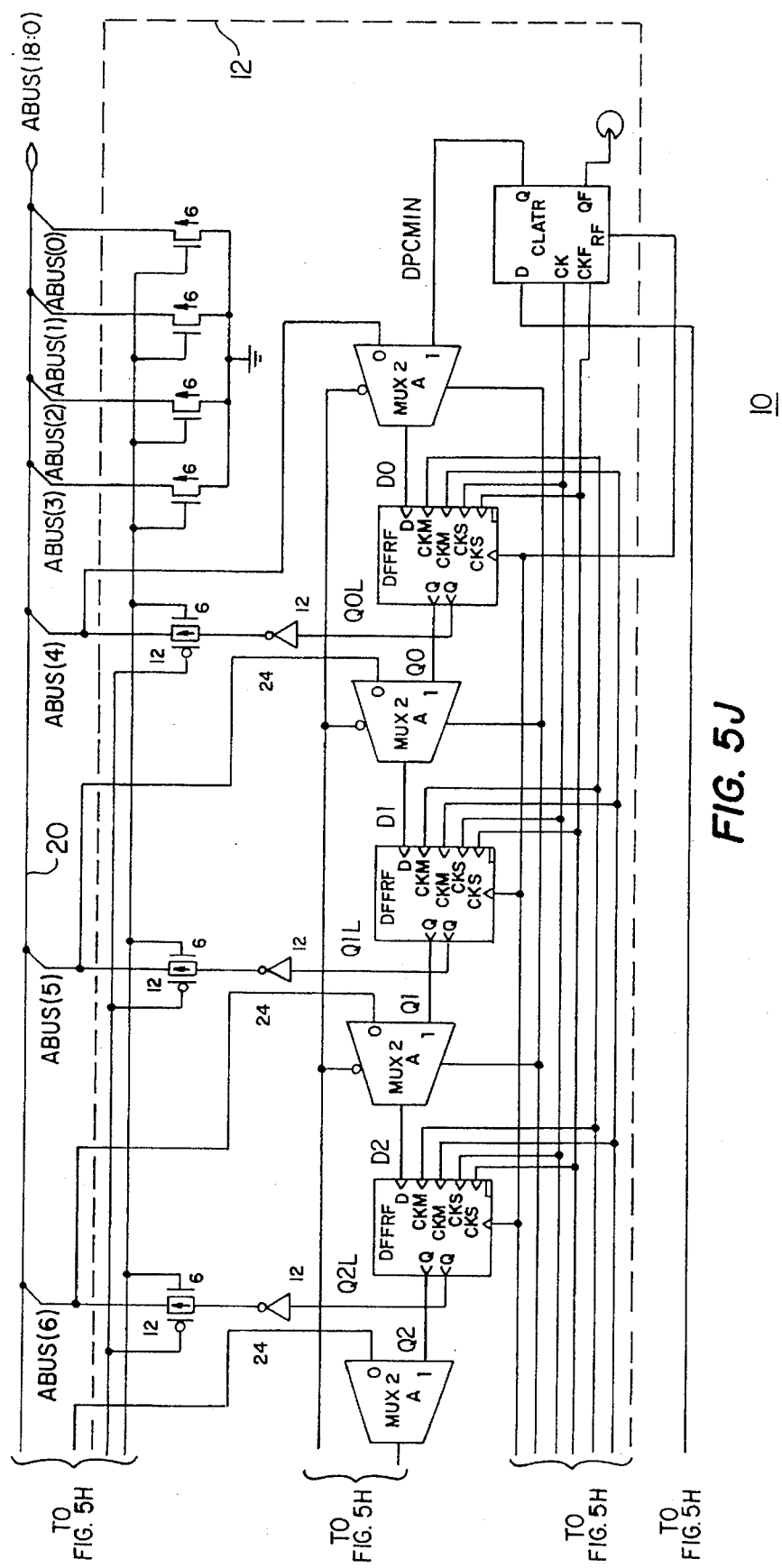

FIG. 4 depicts a master/slave flip-flop circuit used in the preferred embodiment. The master latch 36 portion and slave latch 38 portion of the flip-flop 28 are indicated.

FIG. 5 depicts a schematic for the preferred exemplary I/O data port control logic 40 which operates in conjunction with microcode to operate the interface register 12, temporary register 14, inbound register 16, outbound register 14 and all the mux 32 and transfer gates 34.

The parallel data bus 20 is connected via the transfer gates 34 and the mux 32 to the interface register flip-flops 28. Between the interface register flip-flops are mux switches 32. Similar components are used in the temporary register 14, inbound register 16 and outbound register 18.

One possible application of the present invention is in an integrated circuit for use in a cordless telephone handset and/or base unit, for example, the integrated circuit disclosed in co-pending, commonly assigned application Ser. Nos. 07/917,497; 07/917,489; 07/917,488; 07/918,627; 07/918,626; 07/918,625; 07/918,624; 07/918,631; 07/918,632; 07/918,622; and 07/918,621, each filed on Jul. 21, 1992. Such disclosures are hereby incorporated by reference. If the present invention is so applied to the integrated circuit disclosed in those applications, the integrated circuit can be synchronized to an external 500 Hz signal (slave) or to an internally generated 500 Hz signal (master, default), to meet the requirements of CT2 Annex N for CFP's.

The present invention offers lower power requirements and reduced IC real estate requirements over prior art I/O data ports because of the need for less circuitry. Furthermore, the present invention accomplishes simultaneous data receive and transmit to and from a parallel data bus of, for example a DSP. The present invention performs both linear mode input/output and buffered mode input/output functions which allow a parallel data bus to be connected to a variety of peripheral devices via the same data I/O port. Furthermore, the present invention transmits and receives data in either linear or buffered mode through the same registers, thereby decreasing overall circuit size.

As is clearly seen, the present invention is a significant improvement in the art. The present invention is believed to be especially effective when configured and employed as described herein, however, those skilled in the art will readily recognize that numerous variations and substitutions may be made in the invention and its use and configuration to achieve substantially the same results as achieved by the embodiments and, in particular, the preferred embodiment expressly described herein. Each of those variations is intended to be included in the description herein and forms a part of the present invention. The foregoing detailed description is, thus, to be clearly understood as being given by way of illustration and example only, the spirit and scope of the present invention being limited solely by the appended claims.

What is claimed is:

1. An I/O data port circuit electrically connecting a parallel data bus with an input serial data bus and an output serial data bus, and selectively operable in at least a linear mode and a buffered mode, comprising:

an interface register connected in parallel to said parallel data bus, comprising at least two flip-flops;

a temporary register comprising at least two flip-flops, serially connected to at least one of a first most significant flip-flop and a first least significant flip-flop of said interface register;

an outbound register comprising at least two flip-flops, connected in parallel to said temporary register and having at least one of a second most significant flip-flop and a second least significant flip-flop, said second most significant flip-flop connected serially with said output serial data bus; and an inbound register comprising at least two flip-flops, connected in parallel to said temporary register and having at least one of a third most significant and a third least significant flip-flop, said third least significant flip-flop connected serially with said input serial data bus.

2. The I/O data port of claim 1, wherein said I/O data port is configurable to simultaneously transfer a transmit data from said parallel data bus to said output serial data bus and to transfer a receive data from said input serial data bus to said parallel data bus.

3. The I/O data port of claim 2, wherein said transmit data and said receive data propagates through the interface register.

4. The I/O data port of claim 3, wherein the transmit and receive data propagates through the temporary register.

5. The I/O data port of claim 1, wherein said interface register further comprises:

a mux between at least two of said interface register flip-flops.

6. The I/O data port of claim 1, wherein said interface register further comprises:

a transfer gate between at least one said interface register flip-flop and said parallel data bus.

7. The I/O data port of claim 1, wherein said temporary register further comprises:

a mux between at least two of said temporary register flip-flops.

8. The I/O date port of claim 1, wherein said outbound register further comprises:

a mux between at least two of said outbound register flip-flops.

9. The I/O data port of claim 1, further comprising control logic.

10. The I/O data port of claim 1, wherein said I/O data port is an integral part of a DSP IC and said parallel data bus is an internal data bus in said DSP IC.

11. The I/O data port of claim 1, wherein said interface register and said temporary register are selectively operable as a circular shifter.

12. A data input/output port capable of converting parallel data to serial data and serial data to parallel data, comprising:

a first circuit portion capable of receiving a first data in serial form from a first serial bus and placing said first data on a parallel bus, said first circuit portion simultaneously capable of retrieving a second data from said parallel bus and transmitting said second data on a second serial bus, said first and second data propagating through a first same part of said first circuit portion;

a second circuit portion electrically connected to said first circuit portion, said first and second circuit portions combined being capable of receiving a third data from a third serial bus, buffering said third data, and placing said third data on said parallel bus, and being capable of simultaneously receiving a fourth data from said parallel bus, buffering said fourth data, and transmitting said fourth data on a fourth data bus, said third and fourth data propagating through at least a second same part of said second circuit portion.

13. The data input/output port of claim 12, wherein said first serial bus and said third serial bus are the same bus.

14. The data input/output port of claim 12, wherein said second serial bus and said fourth serial bus are the same bus.

15. The data input/output port of claim 12, wherein said second same part of said second circuit is at least a portion of a circular shifter circuit.

16. The data input/output port of claim 12, further comprising switching means for switching between propagating data through said first circuit portion and propagating data through said combination of said first circuit portion and second circuit portion.

17. The data input/output port of claim 12, wherein at least one of said first, second, third and fourth data is at least one of A-law, u-law and ADPCM data.

18. The data input/output port of claim 12, wherein said first data is x-bit data and said third data is y-bit data, wherein x is greater than or equal to y.

19. A method for transferring a first data from a parallel bus to a first serial bus, while simultaneously transferring a second data from a second serial bus to said parallel bus such that said first data and said second data both propagate through the same circuitry, comprising the steps of:

a) latching said first data from said parallel bus to an interface register;

b) latching said second data from an inbound register to a master portion of a temporary register;

c) circularly shifting said first data from said interface register to a slave portion of said temporary register;

d) shifting said second data from said second serial bus to said inbound register;

e) latching said first data from said slave portion of said temporary register to an outbound register;

f) circularly shifting said second data from said master portion of said temporary register to said interface register;

g) latching said second data from said interface register to said parallel bus; and h) shifting said first data from said outbound register to said first serial bus.

\* \* \* \* \*

UNITED STATES PATENT AND TRADEMARK OFFICE
CERTIFICATE OF CORRECTION

PATENT NO. : 5,596,724
DATED : January 21, 1997
INVENTOR(S) : Mullins et al.

It is certified that error appears in the above-identified patent and that said Letters Patent is hereby corrected as shown below:

Title page,
The application number should read 08/191,948.
The last two words of the abstract should read -- serial bus. --.
The Q output in the item 29 in Figure 5F should read "To Fig. 5H" and "To Fig. 5I".
In Figure 3, the reference to item 13 should be deleted.

Column 6,
Line 66, "2-3" should read -- 23 --.

Column 7,
Line 7, "B-bit" should read -- 8-bit --.

Column 10,
Line 28, "date" should read -- data --.
Line 66, "part: of" should read -- part of --.

Signed and Sealed this

Twenty-first Day of August, 2001

Attest:

*Nicholas P. Godici*

NICHOLAS P. GODICI
*Attesting Officer*  *Acting Director of the United States Patent and Trademark Office*